United States Patent
Lung

(10) Patent No.: US 7,440,315 B2
(45) Date of Patent: Oct. 21, 2008

(54) METHOD, APPARATUS AND COMPUTER PROGRAM PRODUCT FOR STEPPED RESET PROGRAMMING PROCESS ON PROGRAMMABLE RESISTIVE MEMORY CELL

(75) Inventor: Hsiang Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 66 days.

(21) Appl. No.: 11/621,455

(22) Filed: Jan. 9, 2007

(65) Prior Publication Data
US 2008/0165572 A1    Jul. 10, 2008

(51) Int. Cl.
G11C 11/00 (2006.01)
(52) U.S. Cl. .............. 365/163; 365/185.18; 365/189.07
(58) Field of Classification Search ................ 365/163, 365/185.18, 189.07
See application file for complete search history.

(56) References Cited

U.S. PATENT DOCUMENTS

| | | | |
|---|---|---|---|
| 3,271,591 | A | 9/1966 | Ovshinsky |
| 3,530,441 | A | 9/1970 | Ovshinsky |
| 4,599,705 | A | 7/1986 | Holmberg et al. |
| 4,719,594 | A | 1/1988 | Young et al. |
| 4,876,220 | A | 10/1989 | Mohsen et al. |
| 4,959,812 | A | 9/1990 | Momodomi et al. |
| 5,166,096 | A | 11/1992 | Cote et al. |
| 5,166,758 | A | 11/1992 | Ovshinsky et al. |
| 5,177,567 | A | 1/1993 | Klersy et al. |
| 5,515,488 | A | 5/1996 | Stephens, Jr. |
| 5,534,712 | A | 7/1996 | Ovshinsky et al. |
| 5,687,112 | A | 11/1997 | Ovshinsky |
| 5,789,277 | A | 8/1998 | Zahorik et al. |
| 5,789,758 | A | 8/1998 | Reinberg |
| 5,814,527 | A | 9/1998 | Wolstenholme et al. |

(Continued)

FOREIGN PATENT DOCUMENTS

WO   WO 00/45108 A1   8/2000

(Continued)

OTHER PUBLICATIONS

Adler, David, "Amorphous-Semiconductor Devices," Sci. Amer., vol. 236, pp. 36-48, May 1977.

(Continued)

*Primary Examiner*—Son Dinh
(74) *Attorney, Agent, or Firm*—James F. Hann; Haynes Beffel & Wolfeld LLP

(57) ABSTRACT

A method, system and computer program product for resetting a phase change memory cell having a memory cell threshold voltage is disclosed. The method includes reading a resistance of the memory cell. If the resistance is larger than a chosen resistance, the resetting of the memory cell ends. Otherwise, the method proceeds by applying a voltage, larger than the memory cell threshold voltage, to the bit line, and applying a voltage $V_{WL}$, larger than the access device threshold voltage, to the word line. The resistance of the memory cell is again read. If the resistance is larger than the chosen resistance, the resetting of the memory cell ends. Otherwise, the method proceeds by applying a voltage, larger than the memory cell threshold voltage, to the bit line, increasing voltage $V_{WL}$ by a voltage $\Delta V$ and applying the increased voltage $V_{WL}$ to the word line.

12 Claims, 11 Drawing Sheets

U.S. PATENT DOCUMENTS

| | | |
|---|---|---|
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,077,674 A | 6/2000 | Schleifer et al. |
| 6,077,729 A | 6/2000 | Harshfield |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,805,563 B2 | 10/2004 | Xu |
| 6,815,704 B1 | 11/2004 | Chen |
| 6,830,952 B2 | 12/2004 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,888,750 B2 | 5/2005 | Walker et al. |
| 6,894,305 B2 | 5/2005 | Yi et al. |
| 6,903,362 B2 | 6/2005 | Wyeth et al. |
| 6,909,107 B2 | 6/2005 | Rodgers et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,992,932 B2 | 1/2006 | Cohen |
| 7,023,009 B2 | 4/2006 | Kostylev et al. |
| 7,033,856 B2 | 4/2006 | Lung et al. |
| 7,042,001 B2 | 5/2006 | Kim et al. |
| 7,067,865 B2 | 6/2006 | Lung et al. |
| 7,132,675 B2 | 11/2006 | Gilton |
| 7,166,533 B2 | 1/2007 | Happ |
| 7,214,958 B2 | 5/2007 | Happ |
| 7,220,983 B2 | 5/2007 | Lung |
| 2004/0248339 A1 | 12/2004 | Lung |
| 2005/0029502 A1 | 2/2005 | Hudgens |
| 2005/0093022 A1 | 5/2005 | Lung |
| 2005/0201182 A1 | 9/2005 | Osada et al. |
| 2005/0212024 A1 | 9/2005 | Happ |
| 2005/0215009 A1 | 9/2005 | Cho |
| 2006/0108667 A1 | 5/2006 | Lung |
| 2006/0110878 A1 | 5/2006 | Lung et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0030721 A1 | 2/2007 | Segal et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |

2007/0176261 A1    8/2007    Lung

FOREIGN PATENT DOCUMENTS

| | | |
|---|---|---|
| WO | WO 00/79539 A1 | 12/2000 |
| WO | WO 01/45108 A1 | 6/2001 |

OTHER PUBLICATIONS

Adler, D. et al., "Threshold Switching in Chalcogenide-Glass Thin Films," J. Appl/Phys 51(6), Jun. 1980, pp. 3289-3309.

AHN, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al. "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM , Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al, "Phase-change Recording Medium that Enables Ultrahigh-density Electron-beam Data Storage," Applied Physics Letter, 2005, 3 pp., vol. 86.

Gill, Manzur et al., "High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3$^{rd}$ E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24 μm-CMOS Technologies," 2003 Symposium on VLSI Technology Digest of Technical Papers, pp. 173-174.

Iwaski, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43$^{rd}$ Annual International Reliability Physics Symposium, San Jose, 2005, pp. 157-162.

Kojima, Rie et al., "Ge-Sn-Sb-Te Phase-change Recording Material Having High Crystallization Speed," Proceeding of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost," www.sciencenews.org, Dec. 18 & 25, 2004, p. 389, vol. 166.

Mott, Nevill, "Electrons in Glass," Nobel Lecture, Dec. 8, 1977, Physics, 1977, pp. 403-413.

"New Memories Tap Spin, Gird for Battle," Science News, Apr. 3, 1999, p. 223, vol. 155.

Ovonyx Non-Confidential paper entitled "Ovonic Unified Memory," Dec. 1999, pp. 1-80.

Ovshinsky, Sandford R., "Reversible Electrical Switching Phenomenia in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel μ Trench Phase-Change Memory Cell for Embedded and Satnd-Alone Non-Volatile Memory Applications,"2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427. vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org, Mar. 19, 2005, p. 189, vol. 167.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search=' nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-Vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Ahn, S. J. et al., "Highly Reliable 5nm Contact Cell Technology for 256Mb PRAM," VLSI Technology, Digest of Technical Papers, Jun. 14-16, 2005, pp. 98-99.

METHOD, APPARATUS AND COMPUTER PROGRAM PRODUCT FOR STEPPED RESET PROGRAMMING PROCESS ON PROGRAMMABLE RESISTIVE MEMORY CELL

CROSS-REFERENCE TO OTHER APPLICATIONS

The subject matter of this patent application is related to the subject matter of the following U.S. patent applications of the same inventor and assigned to the same assignee: U.S. patent application Ser. No. 11/621,431, filed Jan. 9, 2007, entitled "Method, Apparatus and Computer Program Product for Read Before Programming Process on Multiple Programmable Resistive Memory Cells," and U.S. patent application Ser. No. 11/610,293, filed Dec. 13, 2006, entitled "Method, Apparatus and Computer Program Product for Programming Process on Programmable Resistive Memory Cell,"

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on memory materials, for example resistor random access memory (RRAM) devices, and to methods for programming such devices. The memory material is switchable between electrical property states by the application of energy. The memory materials may be phase change based memory materials, including chalcogenide based materials, and other materials.

2. Description of Related Art

These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state; this difference in resistance can be readily sensed to indicate data. These properties have generated interest in using programmable resistive material to form nonvolatile memory circuits, which can be read and written with random access.

In phase change memory, data is stored by causing transitions between amorphous and crystalline states in the phase change material using current. Current heats the material and causes transitions between the states. The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state.

Each memory cell of a phase change memory device is coupled to a bit line and an access device, such as a transistor, wherein the access device is coupled to a word line. The method by which the resistance of a phase change memory cell is read, set or reset involves the application of bias voltages to the bit line and word line for the memory cell. In order to apply a set voltage pulse or a reset voltage pulse to a phase change memory cell, the word and bit lines must be connected to circuitry providing the set voltage pulse or the reset voltage pulse. The creation of these connections for setting or resetting a phase change memory cell is referred to as "bit line set up" and "word line set up." There is a time and resource expenditure associated with the steps taken during bit line setup and word line setup. Therefore, there is a desire to reduce the number of steps taken during bit line setup and word line setup. Furthermore, when handling the programming of successive phase change memory cells in an array of phase change memory cells, word line setup and bit line setup for a first memory cell may necessitate a change if the set/reset programming for a memory cell is different from the set/reset programming of the immediately preceding memory cell. Changing a word line setup or a bit line setup when sequentially programming memory cells also expends time and resources. Therefore, there is a further desire to reduce the number of times a word line setup or a bit line setup is changed when programming successive phase change memory cells in an array of phase change memory cells.

Furthermore, with reference to reset programming, a higher current operation wherein at least a portion of the phase change structure stabilizes in the amorphous state, the reset resistance distribution among programmable resistive memory cells can be wider when the memory cells are subject to a constant reset condition over time. This can lead to memory cell over-reset wherein the phase change material of a memory cell can be pushed past the minimum amorphous state required for detecting high resistance in the memory cell. Therefore, there is a desire to provide ideal reset conditions to memory cells and thus avoid memory cell over-reset.

Accordingly, an opportunity arises to devise methods and structures that provide ideal reset conditions to memory cells and thus reduce or eliminate memory cell over-reset.

BRIEF SUMMARY OF THE INVENTION

A first aspect of the present invention relates to a method for resetting a phase change memory cell having a memory cell threshold voltage, the memory cell threshold voltage being a voltage at which at least a portion of the amorphous phase change material of the memory cell starts to break down, the memory cell coupled to an access device having an access device threshold voltage. The method includes selecting a voltage VWL, voltage VWL being larger than the access device threshold voltage. The method also includes reading a resistance of the memory cell by (a) applying a voltage, smaller than the memory cell threshold voltage, to a bit line coupled to the memory cell, and by (b) applying a voltage, larger than the access device threshold voltage, to a word line coupled to the access device. If the resistance is larger than a chosen resistance, the resetting of the memory cell ends. If the resistance is not larger than the chosen resistance, then the method proceeds by applying a voltage, larger than the memory cell threshold voltage, to the bit line, and applying a voltage VWL to the word line to reset the memory cell. The resistance of the memory cell is again read by (a) applying a voltage, smaller than the memory cell threshold voltage, to the bit line coupled to the memory cells and by (b) applying a voltage, larger than the access device threshold voltage, to the word line. If the resistance is larger than a chosen resistance, the resetting of the memory cell ends. If the resistance is not larger than the chosen resistance, then the method proceeds by applying a voltage, larger than the memory cell threshold voltage, to the bit line, increasing voltage VWL by a voltage ΔV, and applying increased voltage VWL to the word line. The method further includes returning to the second reading step.

A second aspect of the present invention relates to a method for resetting a phase change memory cell having a memory cell threshold voltage, the memory cell threshold voltage being a voltage at which at least a portion of the amorphous phase change material of the memory cell starts to break down, the memory cell coupled to an access device having an access device threshold voltage. The method includes reading a first resistance of the memory cell by (a) applying a voltage, smaller than the memory cell threshold voltage, to a bit line coupled to the memory cell, and by (b) applying a voltage, larger than the access device threshold voltage, to a word line coupled to the access device. If the first resistance is larger than a chosen resistance, the resetting of the memory cell ends. If the first resistance is not larger than the chosen resistance, then the method proceeds by applying a voltage, larger than the memory cell threshold voltage, to the bit line, and applying a voltage VWL, larger than the access device threshold voltage, to the word line. The method further includes reading a second resistance of the memory cell by (a) applying a voltage, smaller than the memory cell threshold voltage, to the bit line, and (b) applying a voltage, larger than the access device threshold voltage, to the word line. If the second resistance is larger than the chosen resistance, the resetting of the memory cell ends. If the second resistance is not larger than the chosen resistance, then the method proceeds by applying a voltage, larger than the memory cell threshold voltage, to the bit line, increasing voltage VWL to obtain an increased voltage VWL, and applying the increased voltage VWL to the word line.

A third aspect of the present invention relates to a method for resetting a phase change memory cell having a memory cell threshold voltage, the memory cell threshold voltage being a voltage at which at least a portion of the amorphous phase change material of the memory cell starts to break down, the memory cell coupled to a pair of MOSFETs having an access device threshold voltage. The method includes applying a first voltage to a bit line coupled with the memory cell, wherein the first voltage is lower than the memory cell threshold voltage, and applying a second voltage to a pair of word lines coupled to the pair of MOSFETs, so as to read a first resistance of the memory cell, the second voltage being greater than the access device threshold voltage. If the first resistance is larger than a chosen resistance, the resetting of the memory cell ends, and if not the method proceeds by applying a third voltage to the bit line, wherein the third voltage is higher than the memory cell threshold voltage, and applying a fourth voltage to the pair of word lines so as to program the memory cell, the fourth voltage being greater than the access device threshold voltage. The method further includes applying the first voltage to the bit line and applying the second voltage to the pair of word lines, so as to read a second resistance of the memory cell. If the second resistance is larger than a chosen resistance, the resetting of the memory cell ends, and if not the method proceeds by applying the third voltage to the bit line and applying a fifth voltage to the pair of word lines so as to program the memory cell, the fifth voltage being the sum of the fourth voltage and a predetermined voltage.

A fourth aspect of the present invention relates to a programmable resistive memory system that comprises a memory cell device comprising a plurality of programmable resistive memory cells, wherein each memory cell has a memory cell threshold voltage, the memory cell threshold voltage being a voltage at which at least a portion of the amorphous phase change material of the memory cell starts to break down, and wherein each memory cell is coupled to an access device having an access device threshold voltage. The programmable resistive memory system further comprises a controller for programming the memory cell device, the controller configured for resetting a memory cell by selecting a voltage VWL, voltage VWL being larger than the access device threshold voltage, and reading a resistance of the memory cell by (a) applying a voltage, smaller than the memory cell threshold voltage, to a bit line coupled to the memory cell, and by (b) applying a voltage, larger than the access device threshold voltage, to a word line coupled to the access device. If the resistance is larger than a chosen resistance, end the resetting of the memory cell. If the resistance is not larger than the chosen resistance, then proceed by applying a voltage, larger than the memory cell threshold voltage, to the bit line and applying voltage VWL to the word line to reset the memory cell. The resistance of the memory cell is again read by (a) applying a voltage, smaller than the memory cell threshold voltage, to the bit line coupled to the memory cell, and by (b) applying a voltage, larger than the access device threshold voltage, to the word line. If the resistance is larger than a chosen resistance, the resetting of the memory cell ends. If the resistance is not larger than the chosen resistance, then the method proceeds by applying a voltage, larger than the memory cell threshold voltage, to the bit line, increasing voltage VWL by a voltage ΔV, and applying increased voltage VWL to the word line. The method further includes returning to the second reading step.

A fifth aspect of the present invention relates to a computer program product including computer instructions for programming a memory cell device comprising a plurality of programmable resistive memory cells, wherein each memory cell has a memory cell threshold voltage, the memory cell threshold voltage being a voltage at which at least a portion of the amorphous phase change material of the memory cell starts to break down, and wherein each memory cell is coupled to an access device having an access device threshold voltage. The computer instructions include instructions for executing the following for resetting a memory cell. Selecting a voltage VWL, voltage VWL being larger than the access device threshold voltage, and reading a resistance of the memory cell by (a) applying a voltage, smaller than the memory cell threshold voltage, to a bit line coupled to the memory cell, and by (b) applying a voltage, larger than the access device threshold voltage, to a word line coupled to the access device. If the resistance is larger than a chosen resistance, the resetting of the memory cell ends. If the resistance is not larger than the chosen resistance, then the computer instructions proceed by applying a voltage, larger than the memory cell threshold voltage, to the bit line, and applying voltage VWL to the word line to reset the memory cell. The resistance of the memory cell is again read by (a) applying a voltage, smaller than the memory cell threshold voltage, to the bit line coupled to the memory cell, and by (b) applying a voltage, larger than the access device threshold voltage, to the word line. If the resistance is larger than a chosen resistance, the resetting of the memory cell ends. If the resistance is not larger than the chosen resistance, then the method proceeds by applying a voltage, larger than the memory cell threshold voltage, to the bit line, increasing voltage VWL by a voltage ΔV, and applying increased voltage VWL to the word line. The method further includes returning to the second reading step.

Various features and advantages of the invention will appear from the following description in which the preferred embodiments have been set forth in detail in conjunction with the accompanying drawings.

DETAILED DESCRIPTION OF THE INVENTION

Figure 1:
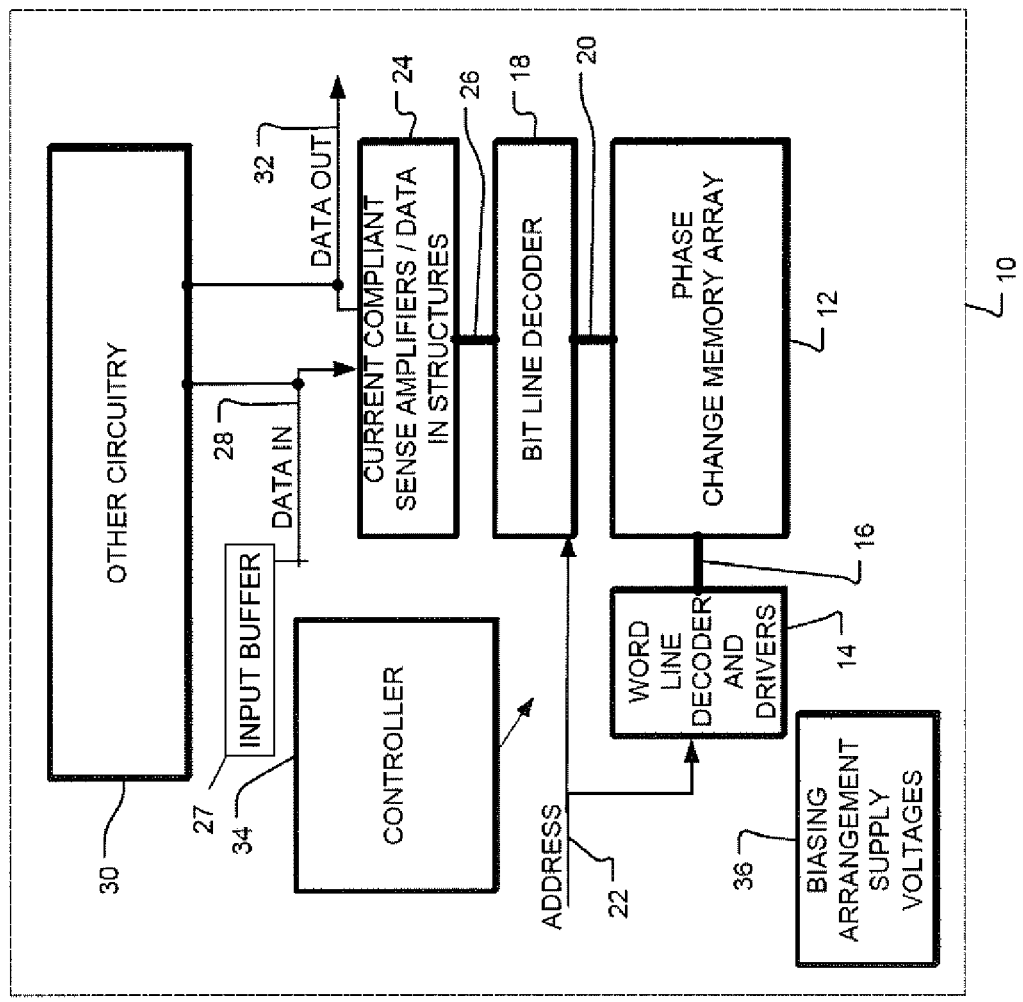
FIG. 1 is a block diagram of an integrated circuit device in accordance with the present invention.

The following description of the invention will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

Referring to FIG. 1, shown is a simplified block diagram of an integrated circuit 10 in which the present invention may be implemented. Circuit 10 includes a memory array 12 implemented using phase change memory cells (not shown) on a semiconductor substrate, discussed more fully below. A word line decoder 14 is in electrical communication with a plurality of word lines 16. A bit line decoder 18 is in electrical communication with a plurality of bit lines 20 to read data from, and write data to, the phase change memory cells (not shown) in array 12. Addresses are supplied on bus 22 to word line decoder and drivers 14 and bit line decoder 18. Sense amplifiers and data-in structures in block 24 are coupled to bit line decoder 18 via data bus 26. Data is supplied from an input buffer 27 via a data-in line 28 from input/output ports on integrated circuit 10, or from other data sources internal or external to integrated circuit 10, to data-in structures in block 24. Other circuitry 30 may be included on integrated circuit 10, such as a general purpose processor or special purpose application circuitry, or a combination of modules providing system-on-a-chip functionality supported by array 12. Data is supplied via a data-out line 32 from the sense amplifiers in block 24 to input/output ports on integrated circuit 10, or to other data destinations internal or external to integrated circuit 10.

A controller 34 implemented in this example, using a bias arrangement state machine, controls the application of bias arrangement supply voltages 36, such as read, program, erase, erase verify and program verify voltages. Controller 34 may be implemented using special-purpose logic circuitry as known in the art. In alternative embodiments, controller 34 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 34.

Figure 2:
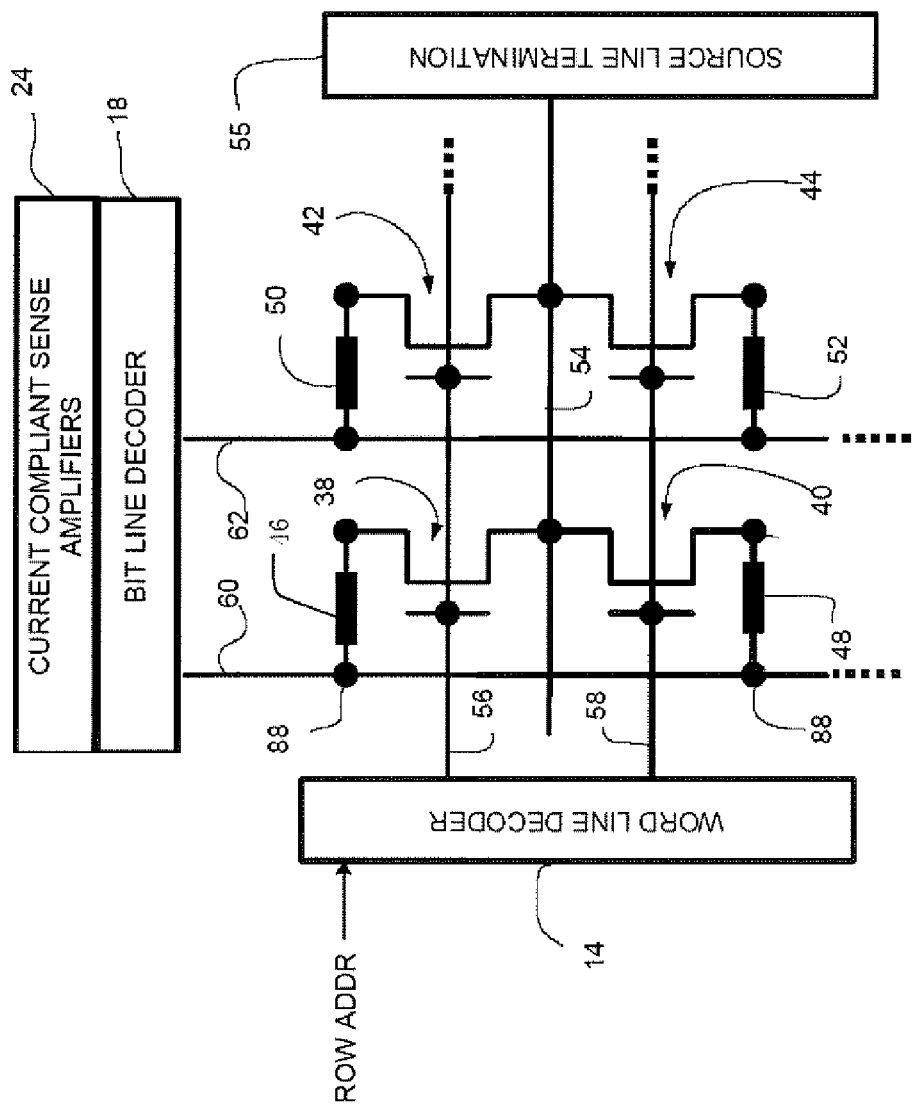
FIG. 2 is a partial schematic diagram of a representative memory array as shown in FIG. 1.

As shown in FIG. 2 each of the memory cells of array 12 includes an access transistor (or other access device such as a diode), four of which are shown as 38, 40, 42 and 44, and a memory element, typically a phase change element, shown as 46, 48, 50 and 52. Sources of each of access transistors 38, 40, 42 and 44 are connected in common to a source line 54 that terminates in a source line termination 55. In another embodiment the source lines of the select devices are not electrically connected, but independently controllable. A plurality 16 of word lines including word lines 56 and 58 extend parallel along a first direction. Word lines 56 and 58 are in electrical communication with word line decoder 14. The gates of access transistors 38 and 42 are connected to a common word line, such as word line 56, and the gates of access transistors 40 and 44 are connected in common to word line 58. A plurality 20 of bit lines including bit lines 60 and 62 have one end of phase change elements 46 and 48 connected to bit line 60 via separate connections 88. Specifically, phase change element 46 is connected between the drain of access transistor 38 and bit line 60, and phase change element 48 is connected between the drain of access transistor 40 and bit line 60. Similarly, phase change element 50 is connected between the drain of access transistor 42 and bit line 62, and phase change element 52 is connected between the drain of access transistor 44 and bit line 62. It should be noted that four memory cells are shown for convenience of discussion and in practice array 12 may comprise thousands to millions of such memory cells.

Also, other array structures may be used, e.g. the phase change memory element is connected to source.

Useful characteristics of a programmable resistive type of memory material, like a phase change material, include the material having a resistance which is programmable, and preferably in a reversible manner, such as by having at least two solid phases that can be reversibly induced by electrical current. These at least two phases include an amorphous phase and a crystalline phase. However, in operation, the programmable resistive material may not be fully converted to either an amorphous or crystalline phase. Intermediate phases or mixtures of phases may have a detectable difference in material characteristics. The two solid phases should generally be bistable and have different electrical properties. The programmable resistive material may be a chalcogenide material. A chalcogenide material may include GST. In following sections of the disclosure, the phase change or other memory material is often referred to as GST, and it will be understood that other types of phase change materials can be used. A material useful for implementation of a memory cell as described herein is $Ge_2Sb_2Te_5$.

A memory cell device 10 as described herein is readily manufacturable using standard lithography and thin film deposition technologies, without requiring extraordinary steps to form sub-lithographic patterns, while achieving very small dimensions for the region of the cell that actually changes resistivity during programming. In embodiments of the invention, the memory material may be a programmable resistive material, typically a phase change material, such as $Ge_2Sb_2Te_5$ or other materials described below. The region in the memory element 16 that changes phase is small; and accordingly, the magnitude of the reset current required for changing the phase is very small.

Embodiments of memory cell device 10 include phase change based memory materials, including chalcogenide based materials and other materials, for memory element 16. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$, where a and b represent atomic percentages that total 100% of the atoms of the constituent elements. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change materials are capable of being switched between a first structural state in which the material is in a generally amorphous solid phase, and a second structural state in which the material is in a generally crystalline solid phase in its local order in the active channel region of the cell. These phase change materials are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change materials can be changed from one phase state to another by application of electrical pulses. It has been observed that a shorter, higher amplitude pulse tends to change the phase change material to a generally amorphous state and is referred to as a reset pulse. A longer, lower amplitude pulse tends to change the phase change material to a generally crystalline state, and is referred to as a program pulse. The energy in a shorter, higher amplitude pulse is high enough to allow for bonds of the crystalline structure to be broken and short enough to prevent the atoms from realigning into a crystalline state. Appropriate profiles for pulses can be determined empirically, without undue experimentation, specifically adapted to a particular phase change material and device structure.

The following are short summaries describing four types of resistive memory materials.

1. Chalcogenide Material
   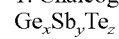
   x:y:z=2:2:5
   Or other compositions with x: 0~5; y: 0~5; z: 0~10
   GeSbTe with doping, such as N—, Si—, Ti—, or other element doping may also be used.

Formation method: By PVD sputtering or magnetron-sputtering method with reactive gases of Ar, $N_2$, and/or He, etc chalcogenide @ the pressure of 1 mtorr~100 mtorr. The deposition is usually done at room temperature. The collimator with aspect ratio of 1~5 can be used to improve the fill-in performance. To improve the fill-in performance, the DC bias of several ten to several hundred volts is also used. On the other hand, the combination of DC bias and the collimator can be used simultaneously.

The post deposition annealing treatment with vacuum or N2 ambient is sometimes needed to improve the crystallize state of chalcogenide material. The annealing temperature typically ranges 100C to 400C with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

2. CMR (Colossal Magneto Resistance) Material $Pr_xCa_yMnO_3$ x:y=0.5:0.5

Or other compositions with x: 0~1; y: 0~1

Another CMR material that includes Mn oxide may be used

Formation method: By PVD sputtering or magnetron-sputtering method with reactive gases of Ar, $N_2$, $O_2$, and/or He, etc. at the pressure of 1 mtorr~100 mtorr. The deposition temperature can range from room temperature to ~600C, depending on the post deposition treatment condition. A collimator with an aspect ratio of 1~5 can be used to improve the fill-in performance. To improve the fill-in performance, the DC bias of several ten to several hundred volts is also used. On the other hand, the combination of DC bias and the collimator can be used simultaneously. A magnetic field of several ten gauss to 10,000 gauss may be applied to improve the magnetic crystallized phase.

The post deposition annealing treatment with vacuum or $N_2$ ambient or $O_2/N_2$ mixed ambient may be needed to improve the crystallized state of CMR material. The annealing temperature typically ranges 400C to 600C with an anneal time of less than 2 hours.

The thickness of CMR material depends on the design of cell structure. The CMR thickness of 10 nm to 200 nm can be used to be the core material.

A buffer layer of YBCO (YBaCuO3, a kind of high temperature superconductor material) is often used to improve the crystallized state of CMR material. The YBCO is deposited before the deposition of CMR material. The thickness of YBCO ranges 30 nm to 200 nm.

3. 2-Element Compound $Ni_xO_y$; $Ti_xO_y$; $Al_xO_y$; $W_xO_y$; $Zn_xO_y$; $Zr_xO_y$; $Cu_xO_y$; etc x:y=0.5:0.5

Other compositions with x: 0~1; y: 0~1

Formation method:

A. Deposition: By PVD sputtering or magnetron-sputtering method with reactive gases of Ar, $N_2$, $O_2$, and/or He, etc. at the pressure of 1 mtorr~100 mtorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually done at room temperature. A collimator with an aspect ratio of 1~5 can be used to improve the fill-in performance. To improve the fill-in performance, the DC bias of several ten to several hundred volts is also used. If desired, they combination of DC bias and the collimator can be used simultaneously.

The post deposition annealing treatment with vacuum or $N_2$ ambient or $O_2/N_2$ mixed ambient as sometimes needed to improve the oxygen distribution of metal oxide. The annealing temperature ranges 400C to 600C with an anneal time of less than 2 hours.

B. Reactive deposition: By PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mtorr~100 mtorr~100 mtorr, using a target of metal oxide, such as Ni, Ti, Al, W, Zn, Zr, or Cu etc. The deposition is usually done at room temperature. A collimator with an aspect ratio of 1~5 can be used to improve the fill-in performance. To improve the fill-in performance, a DC bias of several ten to several hundred volts is also used. If desired, the combination of DC bias and the collimator can be used simultaneously.

The post deposition annealing treatment with vacuum or $N_2$ ambient or $O_2/N_2$ mixed ambient is sometimes needed to improve the oxygen distribution of metal oxide. The annealing temperature ranges 400C to 600C with an anneal time of less than 2 hours.

C. Oxidation: By a high temperature oxidation system, such as furnace or RTP system. The temperature ranges from 200C to 700C with pure $O_2$ or $N_2/O_2$ mixed gas at a pressure of several mtorr to 1 atm. The time can range several minute to hours. Another oxidation method is plasma oxidation. An RF or a DC source plasma with pure $O_2$ or $Ar/O_2$ mixed gas or $Ar/N_2/O_2$ mixed gas at a pressure of 1 mtorr to 100 mtorr is used to oxidize the surface of metal, such as Ni, Ti, Al, W, Zn, Zr, or Cu etc. The oxidation time ranges several seconds to several minutes. The oxidation temperature ranges room temperature to 300C, depending on the degree of plasma oxidation.

4. Polymer Material

TCNQ with doping of Cu, $C_{60}$, Ag etc.

PCBM-TCNQ mixed polymer

Formation method:

A. Evaporation: By thermal evaporation, e-beam evaporation, or molecular beam epitaxy (MBE) system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of 10-4 torr to 10-10 torr. The wafer temperature ranges from room temperature to 200C.

The post deposition annealing treatment with vacuum or $N_2$ ambient is sometimes needed to improve the composition distribution of polymer material. The annealing temperature ranges room temperature to 300C with an anneal time of less than 1 hour.

B. Spin-coat: By a spin-coater with the doped-TCNQ solution @ the rotation of less than 1000 rpm. After spin-coating, the wafer is put to wait the solid-state formation @ room temperature or temperature of less than 200C. The waiting time ranges from several minutes to days, depending on the temperature and on the formation conditions.

Figure 3:
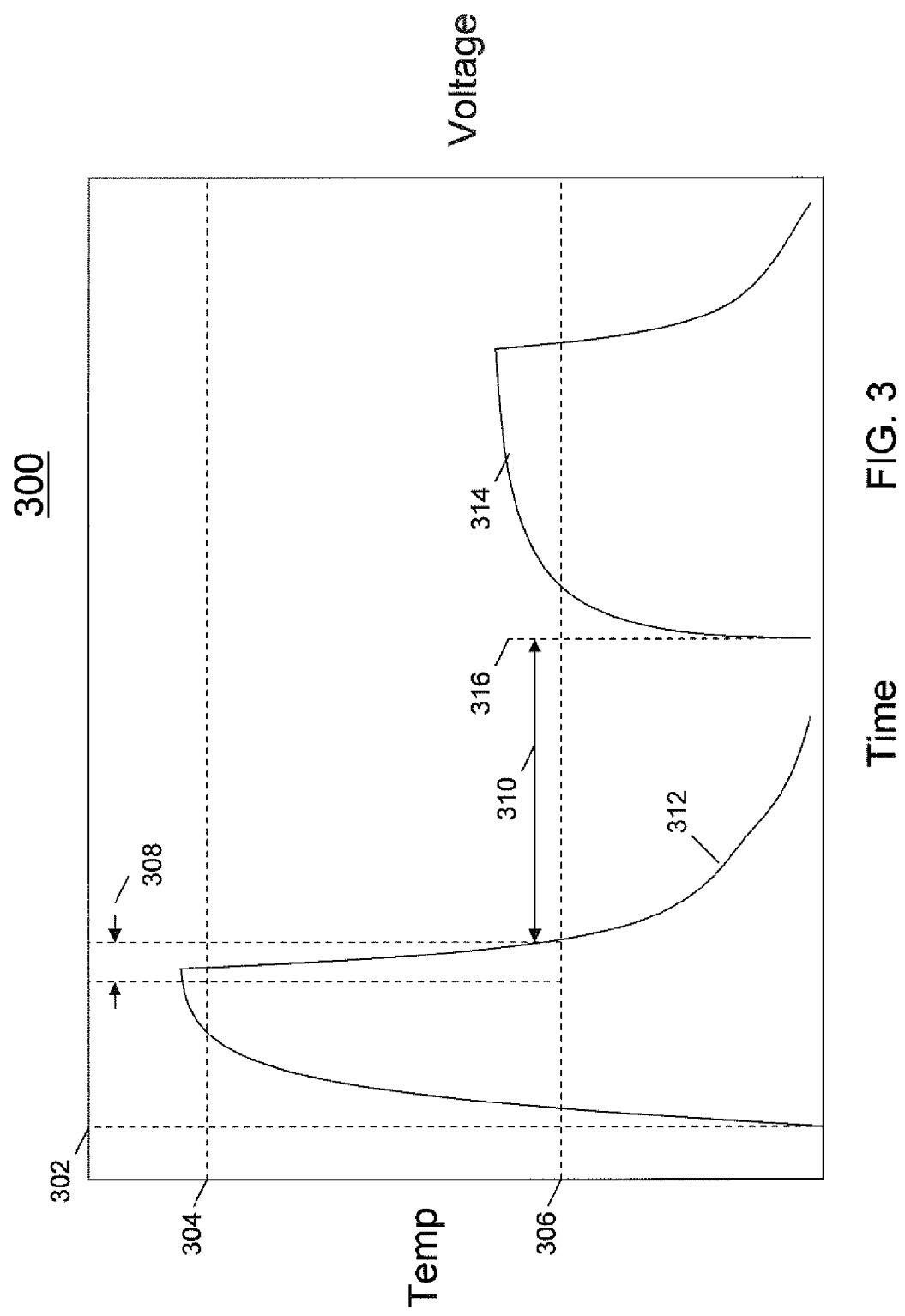
FIG. 3 is a graph of voltage and temperature versus time for pulses used for programming programmable resistive memory cells, according to one embodiment of the present invention.

FIG. 3 is a graph 300 of voltage and temperature versus time for pulses used for programming programmable resistive memory cells, according to one embodiment of the present invention. As explained above, in phase change memory, data is stored by causing transitions between amorphous and crystalline states in the phase change material using current. Current heats the phase change material and causes transitions between the states. FIG. 3 describes the electrical pulses used to cause the transitions. Specifically, FIG. 3 describes the bias voltages that are applied to bit lines and word lines of a memory cell. The y-axis of graph 300 indicates the magnitude of the bias voltage applied to a phase change material, as well as the temperature to which the phase change material is heated by each pulse. The x-axis of graph 300 indicates the passage of time as the voltage applied to a phase change material and as the temperature of the phase change material increases and decrease over time.

Line 302 indicates the beginning of a RESET pulse 312, which converts a phase change material into an amorphous, high resistance state. The change from crystalline to amorphous, referred to as reset herein, is generally a higher current operation, which includes a short high current density pulse to melt the crystalline structure, after which the phase change material cools quickly, quenching the phase change process, allowing at least a portion of the phase change structure to stabilize in the amorphous state Line 304 indicates the temperature at which the phase change material transforms into an amorphous state. Note that pulse 312 increases the temperature past line 304. The quenching phase is indicated by the set of lines 308, wherein the phase change process that transforms the phase change material from crystalline to amorphous is quenched or supplied with the appropriate energy.

Line 316 indicates the beginning of a SET pulse 314, which converts a phase change material into a crystalline, low resistance state. The change from the amorphous to the crystalline state is generally a longer pulse but a lower current operation. Line 306 indicates the temperature at which the phase change material transforms into a crystalline state, sometimes called a breakdown transformation, which is lower than the temperature for an amorphous state, indicated by line 304. Note that pulse 314 increases the temperature past line 304. Also shown is interim 310, which indicates the wait time that must be tolled between the activation of SET pulse 314 after the RESET pulse 312 completes the quench process. Line 306 corresponds to the threshold voltage of the phase change elements 46-52, discussed in more detail below, above which the bit line voltage is set to achieve set pulse 314.

Figure 4:
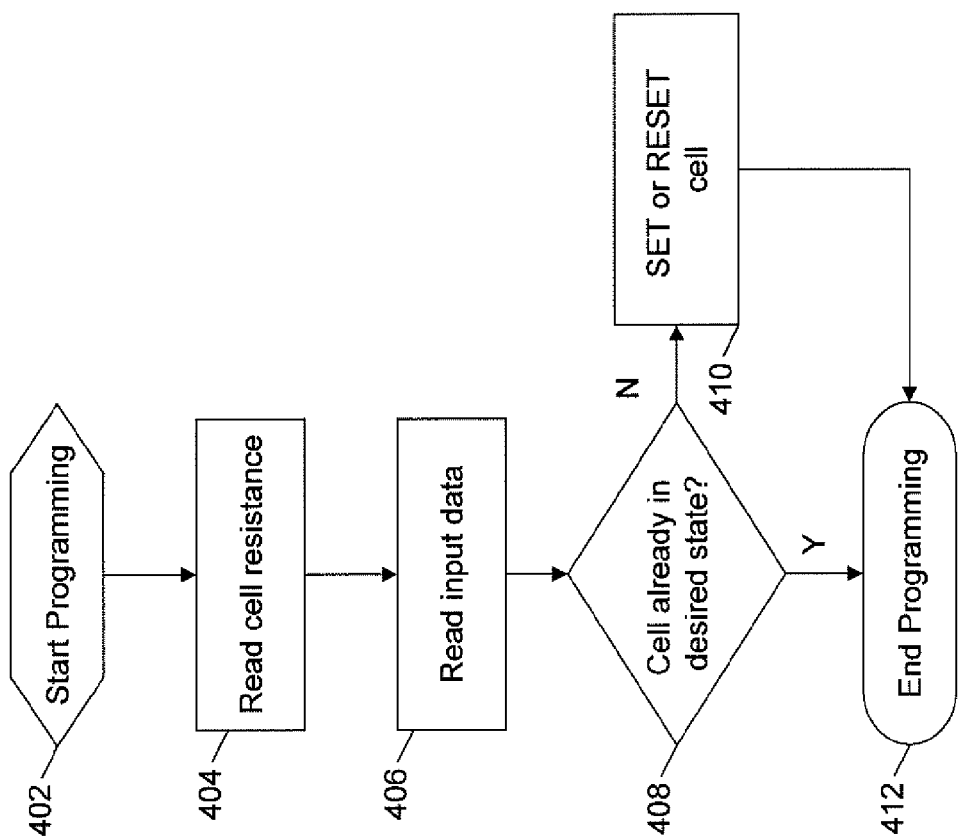
FIG. 4 is a flowchart showing the control flow of a general process for programming a single memory cell comprising a phase change material, in accordance with one embodiment of the present invention.

FIG. 4 is a flowchart showing the control flow of a general process for programming a single memory cell comprising a phase change material, in accordance with one embodiment of the present invention. Specifically, the flowchart of FIG. 4 describes that process that takes place when a controller, such as controller 34, programs (that is, sets or resets) a single memory cell of a phase change memory device comprising a plurality of memory cells. FIG. 4 begins with step 402 and proceeds directly to step 404. In step 404, the resistance of the memory cell is read. In step 406, input data, representing the data that must be reflected by the state of the memory cell, is read. In step 408, it is determined whether the resistance of the memory cell is in a state that reflects the input data. For example, if the resistance of the memory cell is high and the input data indicates a "0," or if the memory cell is low and the input data indicates a "1," then the resistance of the memory cell is in a state that reflects the input data. Otherwise, the resistance of the memory cell is not in a state that reflects the input data.

If the result of step 408 is positive, then control flows to step 410. If the result of step 408 is negative, then control flows to step 412. In step 412, the memory cell is either set or reset, depending on the programming process that is taking place. In step 410, the programming process of the flowchart of FIG. 4 ends.

Figure 5:
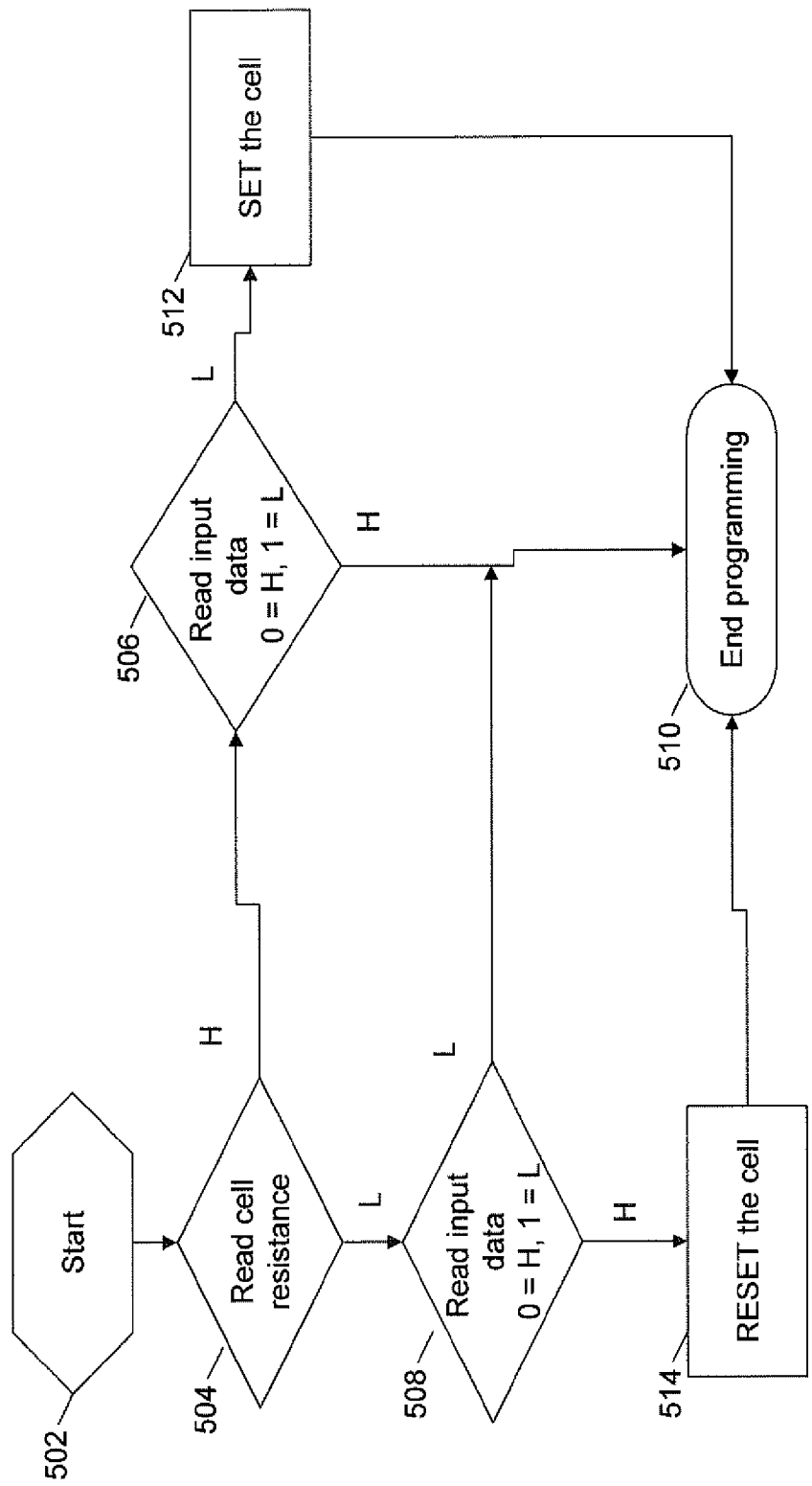
FIG. 5 is a flowchart showing the control flow of the process for programming a single memory cell comprising a phase change material, in accordance with one embodiment of the present invention.

FIG. 5 is a flowchart showing the control flow of the process for programming a single memory cell comprising a phase change material, in accordance with one embodiment of the present invention. Specifically, the flowchart of FIG. 5 describes that process that takes place when a controller, such as controller 34, programs (that is, sets or resets) a single memory cell of a phase change memory device comprising a plurality of memory cells. FIG. 5 provides more detail for the general process described by the flowchart of FIG. 4.

FIG. 5 begins with step 502 and proceeds directly to step 504. In step 504, the resistance of a memory cell at an address is read. In one embodiment of the present invention, the reading step comprises applying a voltage to a bit line coupled to the memory cell and applying a voltage to a word line coupled to an access device, the access device being coupled to the memory cell. If the result of step 504 is that a high resistance is read, indicating the memory cell is in an at least partial amorphous state, then control flows to step 506. If the result of step 504 is that a low resistance is read, indicating the memory cell is in a crystalline state, then control flows to step 508.

In step 506, input data, representing the data that must be reflected by the state of the memory cell, is read. In one embodiment of the present invention, this reading step comprises receiving input data, such as from an input buffer, and evaluating a value of the input data. The input data can be, for example, a single bit value indicating a "0" or a "1." If the result of step 506 is that a first bit value is read, indicating a "0," then control flows to step 510. If the result of step 504 is that a second bit value is read, indicating a "1," then control flows to step 512.

In step 512, the memory cell is set. In an embodiment of the present invention, the step of setting the memory cell comprises applying bias voltages to the bit line and the word line of the memory cell so as to change the memory cell to a crystalline, low resistance state. This step takes place using a lower current via the bit line. This is described in greater detail above with reference to FIG. 3.

In step 508, input data, representing the data that must be reflected by the state of the memory cell, is read. If the result of step 508 is that a first bit value is read, indicating a "0," then control flows to step 514. If the result of step 508 is that a second bit value is read, indicating a "1," then control flows to step 510.

In step 514, the memory cell is reset. In an embodiment of the present invention, the step of resetting the memory cell comprises applying bias voltages to the bit line and the word line of the memory cell so as to change the memory cell to an amorphous, high resistance state. This is described in greater detail above with reference to FIG. 3. In step 510, the programming process of the flowchart of FIG. 5 ends.

Figure 6:
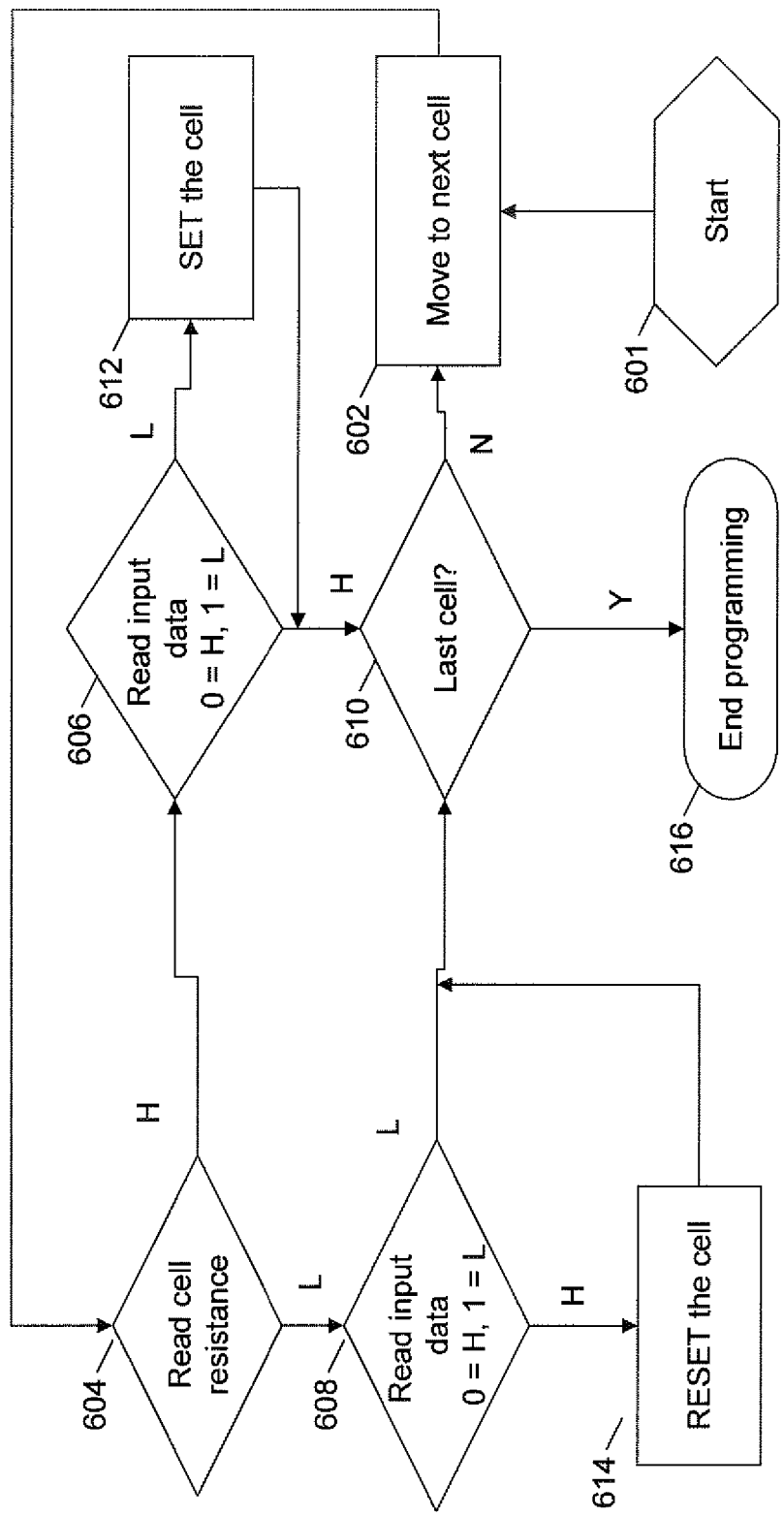
FIG. 6 is a flowchart showing the control flow of the process for sequentially programming a plurality of memory cells comprising a phase change material, in accordance with one embodiment of the present invention.

FIG. 6 is a flowchart showing the control flow of the process for sequentially programming a plurality of memory cells comprising a phase change material, in accordance with one embodiment of the present invention. Specifically, the flowchart of FIG. 6 describes that process that takes place when a controller, such as controller 34, sequentially programs (that is, sets or resets) a plurality of memory cells of a phase change memory device. The process of FIG. 6 is the extension of the process of FIG. 5 to a plurality of memory cells.

FIG. 6 begins with step 601 and proceeds directly to step 602. In step 602, the programming sequence moves to the next available memory cell that is slated for programming in a plurality of memory cells that will be programmed. In step 604, the resistance of a memory cell at an address is read. If the result of step 604 is that a high resistance is read, indicating the memory cell is in an at least partial amorphous state, then control flows to step 606. If the result of step 604 is that a low resistance is read, indicating the memory cell is in a crystalline state, then control flows to step 608.

In step 606, input data, representing the data that must be reflected by the state of the memory cell, is read. In one embodiment of the present invention, this reading step comprises receiving input data, such as from the input buffer, and evaluating a value of the input data. The input data can be, for example, a single bit value indicating a "0" or a "1." If the result of step 606 is that a first bit value is read, indicating a "0," then control flows to step 610. If the result of step 604 is that a second bit value is read, indicating a "1," then control flows to step 612.

In step 612, the memory cell is set. In step 608, input data, representing the data that must be reflected by the state of the memory cell, is read. If the result of step 608 is that a first bit value is read, indicating a "0," then control flows to step 614. If the result of step 608 is that a second bit value is read, indicating a "1," then control flows to step 610.

In step 614, the memory cell is reset. In step 610, it is determined whether there are any additional memory cells that are slated for programming in a plurality of memory cells that will be programmed. If the result of step 610 is negative, then control flows to step 616. If the result of step 610 is positive, then control flows to step 602, where the process of the flowchart of FIG. 6 continues until all memory cells slated for programming have been programmed. In step 616, the programming process of the flowchart of FIG. 6 ends.

Figure 7:
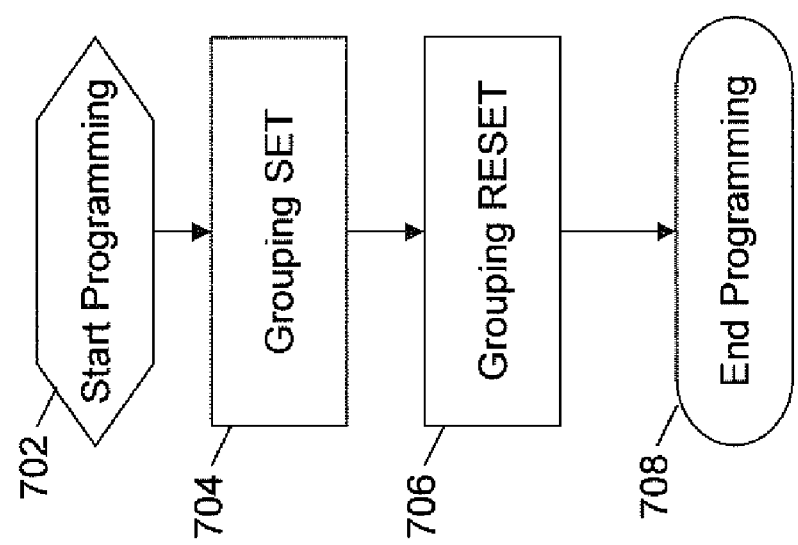
FIG. 7 is a flowchart showing the control flow of the process for group programming of a plurality of memory cells comprising a phase change material, in accordance with one embodiment of the present invention.

FIG. 7 is a flowchart showing the control flow of the process for group programming of a plurality of memory cells comprising a phase change material, in accordance with one embodiment of the present invention. Specifically, the flowchart of FIG. 7 describes that process that takes place when a controller, such as controller 34, programs (that is, sets or resets) a plurality of memory cells of a phase change memory device using a grouping method.

FIG. 7 begins with step 702 and proceeds directly to step 704. In step 704, the controller initiates a group set method wherein a set function is sequentially applied to each memory cell in a group of memory cells. The group set method is described in greater detail below with reference to FIG. 9. In step 706, the controller initiates a group reset method wherein a reset function is sequentially applied to each memory cell in the group of memory cells. The group reset method is described in greater detail below with reference to FIG. 10. In step 708, the process of the flowchart of FIG. 7 ends.

Figure 8:
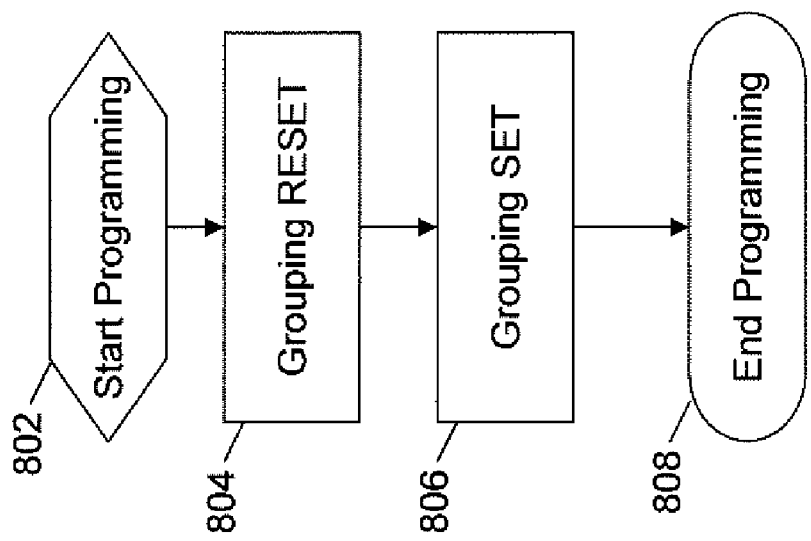
FIG. 8 is a flowchart showing the control flow of the process for group programming of a plurality of memory cells comprising a phase change material, in accordance with another embodiment of the present invention.

FIG. 8 is a flowchart showing the control flow of the process for group programming of a plurality of memory cells comprising a phase change material, in accordance with another embodiment of the present invention. Like the flowchart of FIG. 7, the flowchart of FIG. 8 describes that process that takes place when a controller, such as controller 34, programs (that is, sets or resets) a plurality of memory cells of a phase change memory device using a grouping method. FIG. 8 begins with step 802 and proceeds directly to step 804. In step 804, the controller initiates a group reset method wherein a reset function is sequentially applied to each memory cell in a group of memory cells. The group reset method is described in greater detail below with reference to FIG. 10. In step 806, the controller initiates a group set method wherein a set function is sequentially applied to each memory cell in the group of memory cells. The group set method is described in greater detail below with reference to FIG. 9. In step 808, the process of the flowchart of FIG. 8 ends.

Figure 9:
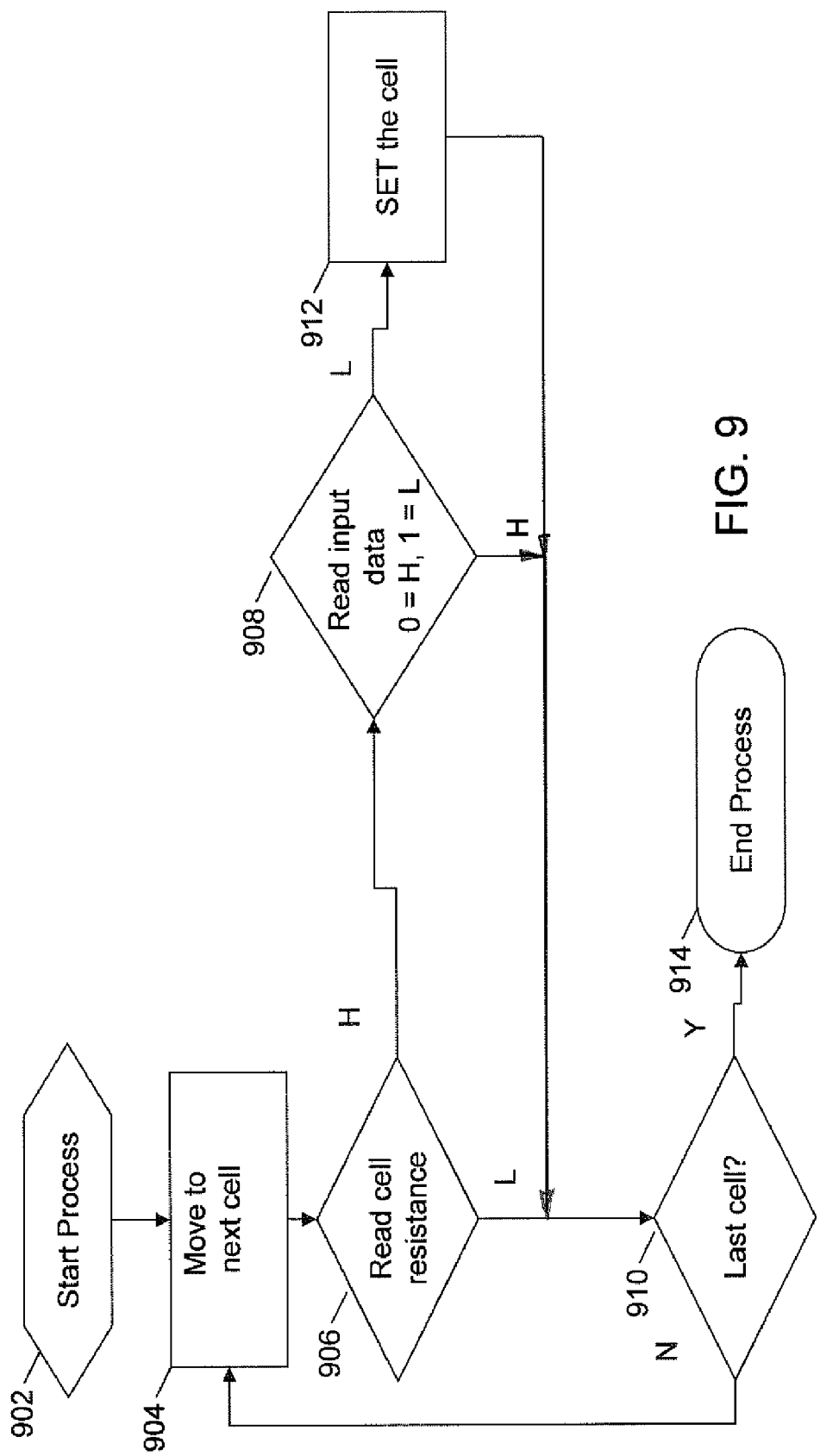
FIG. 9 is a flowchart showing the control flow of the group set process for programming a plurality of memory cells comprising a phase change material, in accordance with one embodiment of the present invention.

FIG. 9 is a flowchart showing the control flow of the group set process for programming a plurality of memory cells comprising a phase change material, in accordance with one embodiment of the present invention. Specifically, the flowchart of FIG. 9 describes that process that takes place when a controller, such as controller 34, sequentially applies a set process to a group of memory cells in a phase change memory device. FIG. 9 begins with step 902 and proceeds directly to step 904. In step 904, the programming sequence moves to the next available memory cell in the group of memory cells to which the group set method is being applied.

In step 906, the resistance of a memory cell at an address is read. If the result of step 906 is that a high resistance is read, indicating the memory cell is in an at least partial amorphous state, then control flows to step 908. If the result of step 906 is that a low resistance is read, indicating the memory cell is in a crystalline state, then control flows to step 910.

In step 908, input data, representing the data that must be reflected by the state of the memory cell, is read. The input data can be, for example, a single bit value indicating a "0" or a "1." If the result of step 908 is that a first bit value is read, indicating a "0," then control flows to step 910. If the result of step 908 is that a second bit value is read, indicating a "1," then control flows to step 912. In step 912, the memory cell is set.

In step 910, it is determined whether the current memory cell is the last memory cell in the group of memory cells to which the group set method is being applied. If the result of step 910 is negative, then control flows to step 904, where the process of the flowchart of FIG. 9 continues until all memory cells in the group have experienced the group set method. If the result of step 910 is positive, then control flows to step 914, where the group set process of the flowchart of FIG. 9 ends.

Figure 10:
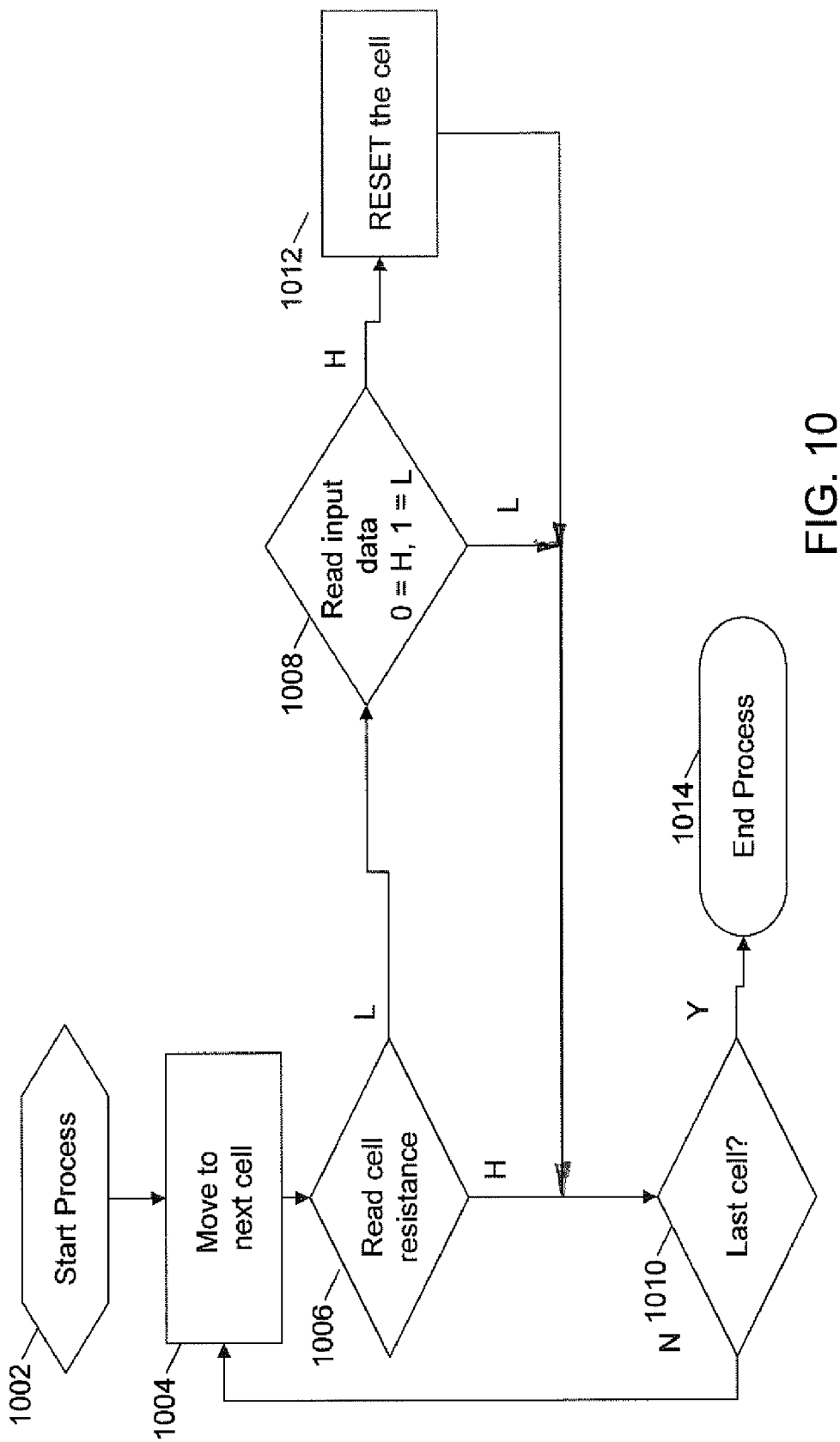
FIG. 10 is a flowchart showing the control flow of the group reset process for programming a plurality of memory cells comprising a phase change material, in accordance with one embodiment of the present invention.

FIG. 10 is a flowchart showing the control flow of the group reset process for programming a plurality of memory cells comprising a phase change material, in accordance with one embodiment of the present invention. Specifically, the flowchart of FIG. 10 describes that process that takes place when a controller, such as controller 34, sequentially applies a reset method to a group of memory cells in a phase change memory device. FIG. 10 begins with step 1002 and proceeds directly to step 1004. In step 1004, the programming sequence moves to the next available memory cell in the group of memory cells to which the group reset process is being applied.

In step 1006, the resistance of a memory cell at an address is read. If the result of step 1006 is that a high resistance is read, indicating the memory cell is in an at least partial amorphous state, then control flows to step 1010. If the result of step 1006 is that a low resistance is read, indicating the memory cell is in a crystalline state, then control flows to step 1008.

In step 1008, input data, representing the data that must be reflected by the state of the memory cell, is read. The input data can be, for example, a single bit value indicating a "0" or a "1." If the result of step 1008 is that a first bit value is read, indicating a "0," then control flows to step 1012. If the result of step 1008 is that a second bit value is read, indicating a "1", then control flows to step 1010. In step 1012, the memory cell is reset.

In step 1010, it is determined whether the current memory cell is the last memory cell in the group of memory cells to which the group reset method is being applied. If the result of step 1010 is negative, then control flows to step 1004, where the process of the flowchart of FIG. 10 continues until all memory cells in the group have experienced the group reset method. If the result of step 1010 is positive, then control flows to step 1014, where the group reset process of the flowchart of FIG. 10 ends.

Figure 11:
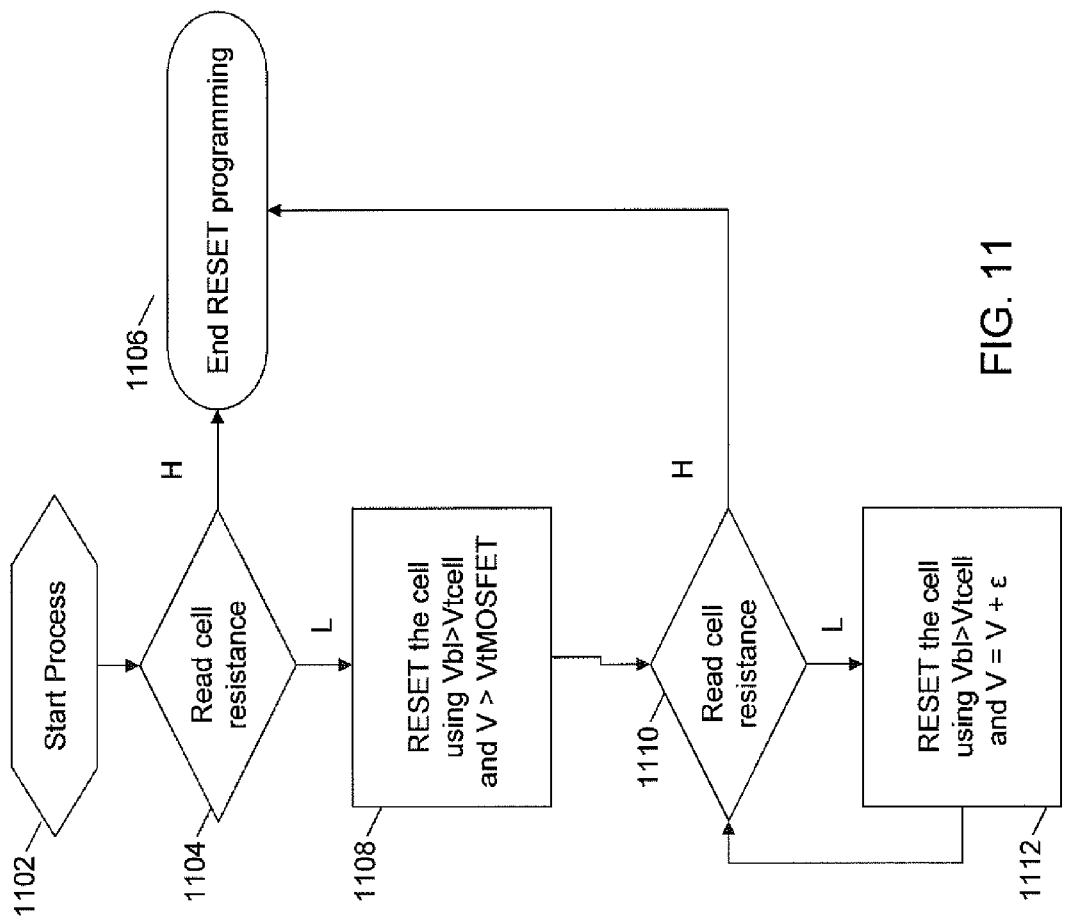
FIG. 11 is a flowchart showing the control flow of the process for reset programming a memory cell comprising a phase change material, in accordance with one embodiment of the present invention.

FIG. 11 is a flowchart showing the control flow of the process for reset programming a memory cell comprising a phase change material, in accordance with one embodiment of the present invention. Specifically, the flowchart of FIG. 11 describes that process that takes place when a controller, such as controller 34, reset programs a memory cell of a phase change memory device comprising a plurality of memory cells.

FIG. 11 begins with step 1102 and proceeds directly to step 1104. In step 1104, the resistance of a memory cell at an address is read. In one embodiment of the present invention, the reading step may comprise applying a voltage to a word line coupled to an access device, such as a pair of MOSFETs, the access device being coupled to the memory cell. The access device further has a threshold voltage (referred to as "VtMOSFET" in FIG. 11).

If the result of step 1104 is that a high resistance is read, indicating the memory cell is in an at least partial amorphous state, then control flows to step 1106. If the result of step 1104 is that a low resistance is read, indicating the memory cell is in a crystalline state, then control flows to step 1108. In step 1106, the reset programming process ends. In step 1108, the memory cell is reset. In an embodiment of the present invention, the step of resetting the memory cell comprises applying bias voltages to the bit line and the word line of the memory cell so as to change the memory cell to an amorphous, high resistance state. This step takes place using a higher current, which includes a short high current density pulse to melt the crystalline structure into an amorphous state. Specifically, the voltage applied to the bit line (referred to as "Vbl" in FIG. 11) is greater than the threshold voltage of the memory element (referred to as "Vtcell" in FIG. 11) and the voltage V applied to the word line is greater than the access device threshold voltage.

In step 1110, the resistance of the memory cell is read again, as described for step 1104 above. If the result of step 1110 is that a high resistance is read, then control flows to step 1106. If the result of step 1110 is that a low resistance is read, then control flows to step 1112. In step 1112, the memory cell is reset once more. In this step, the voltage V is increased by an amount (referred to as "ϵ" in FIG. 11) and then a voltage greater than the memory element threshold voltage is applied to the bit line and the increased voltage V is applied to the word line. Control then flows back to step 1110 where the process of checking the resistance of the memory cell (step 1110), increasing the word line voltage V (step 1112) and applying the voltage V to the word line (step 1112) is executed until the resistance of the memory cell is high, indicating an amorphous state of the memory cell.

Figure 12:
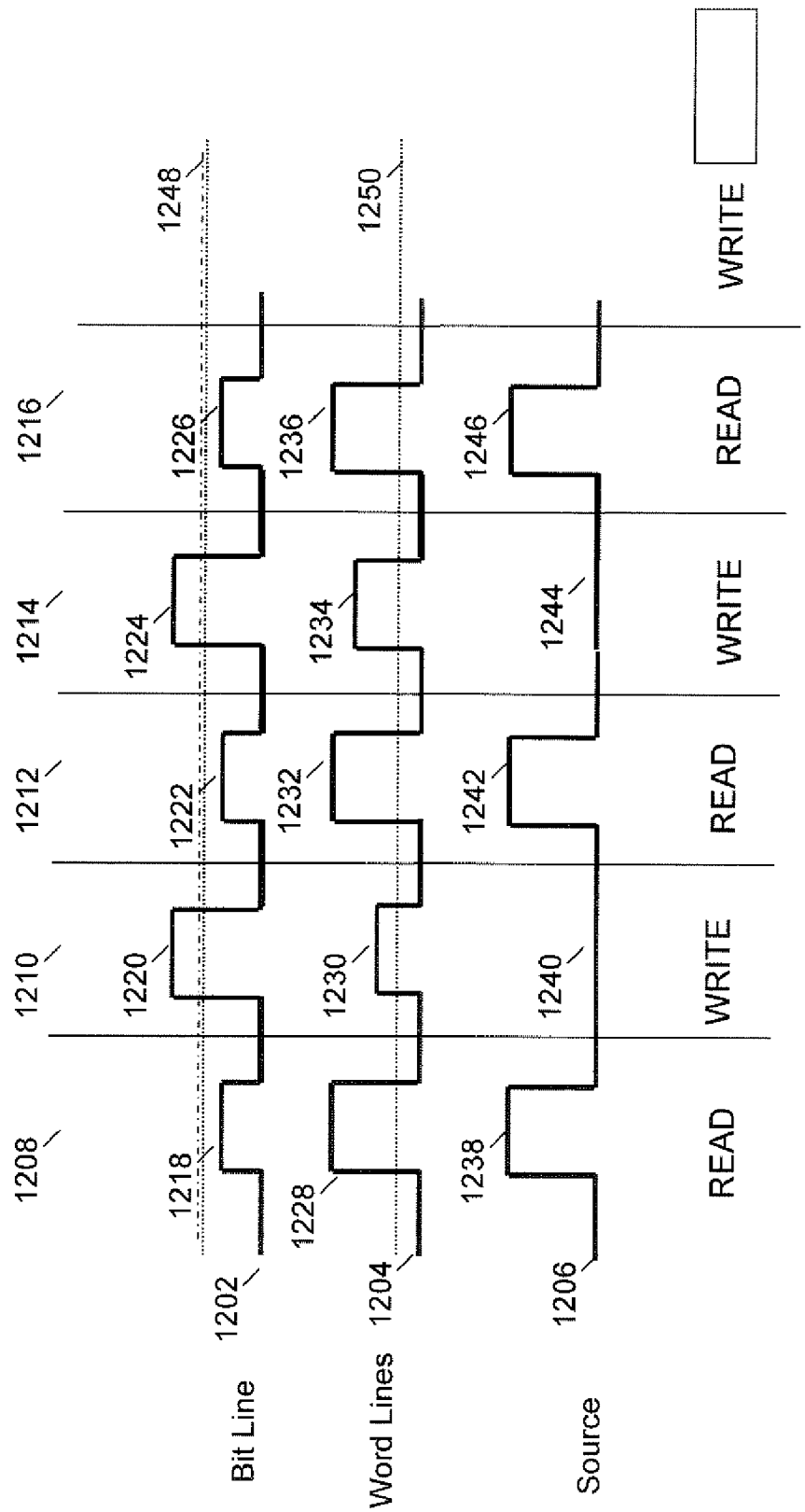
FIG. 12 is a graph showing the magnitude of electrical impulses when reading and writing to a memory cell comprising a phase change material, in accordance with one embodiment of the present invention.

FIG. 12 is a graph showing the magnitude of electrical impulses when reading and writing to a memory cell comprising a phase change material, in accordance with one embodiment of the present invention. Specifically, the graph of FIG. 12 describes the electrical impulses applies to certain elements during successive read and write steps when reset programming a memory cell of a phase change memory device comprising a plurality of memory cells. First row 1202 shows the electrical impulses applied to the bit line of a memory cell, second row 1204 shows the electrical impulses applied to a word line pair of the memory cell and third row 1206 shows the electrical impulses applied to a source line of the memory cell. First column 1208 indicates the electrical impulse applied during a first read step, second column 1210 indicates the electrical impulse applied during a first write step, third column 1212 indicates the electrical impulse applied during a second read step, fourth column 1214 indicates the electrical impulse applied during a second write step, and fifth column 1216 indicates the electrical impulse applied during a third read step.

The first read step 1208 (effectuated to read a resistance of the memory cell) may comprise applying an impulse 1218 to the bit line, wherein the voltage of the impulse 1218 is less than the memory cell threshold voltage (indicated by line 1248). The memory cell threshold voltage is a voltage at which at least a portion of the amorphous phase change material of the memory cell starts to break down. The first read step 1208 may further comprise applying an impulse 1228 to the word lines, wherein the voltage of the impulse 1228 is greater than the threshold voltage of an access device, such as a pair of MOSFETs, coupled to the memory cell. The threshold voltage is indicated by line 1250. The first read step 1208 may further comprise applying an impulse 1238 to the source line. If the resistance read is larger than a chosen resistance, the resetting of the memory cell is ended.

If the resistance of the memory cell is not higher than a threshold value, then the first write step 1210 is executed. The first write step 1210 (effectuated to reset a memory cell) may comprise applying an impulse 1220 to the hit line, wherein the voltage of the impulse 1220 is greater than the memory cell threshold voltage (indicated by line 1248). The first write step 1210 may further comprise applying an impulse 1230 to the word lines, wherein the voltage of the impulse 1230 is greater than the threshold voltage of the access device (the threshold voltage is indicated by line 1250). The first write step 1210 may further comprise applying no impulse 1240 to the source line.

The second read step 1212 (effectuated to read a resistance of the memory cell) is identical to the first read step 1208 and therefore may comprise applying an impulse 1222 to the bit line, wherein the voltage of the impulse 1222 is less than the memory cell threshold voltage. The second read step 1212 may further comprise applying an impulse 1232 to the word lines, wherein the voltage of the impulse 1232 is greater than the threshold voltage of the access device. The second read step 1212 may further comprise applying an impulse 1242 to the source line. If the resistance read is larger than a chosen resistance, the resetting of the memory cell is ended.

If the resistance of the memory cell is not higher than a threshold value, then the second write step 1214 is executed. The second write step 1214, similar to first write step 1210 (effectuated to reset a memory cell), may comprise applying an impulse 1224 to the bit line, wherein the voltage of the impulse 1224 is greater than the memory cell threshold voltage. The second write step 1214 may further comprise applying no impulse 1244 to the source line. The second write step 1214 may further comprise applying an impulse 1234 to the word lines, wherein the voltage of the impulse 1234 is equal to the voltage of the impulse 1230 applied in write step 1210 plus a set voltage amount, voltage $\Delta V$. Voltage $\Delta V$ typically is but may not be a constant voltage. The voltage of the impulse 1234 is greater than the threshold voltage of the access device.

The third read step 1216 (effectuated to read a resistance of the memory cell) is identical to the second read step 1212 and therefore may comprise applying an impulse 1226 to the bit line, wherein the voltage of the impulse 1226 is less than the memory cell threshold voltage. The third read step 1216 may further comprise applying an impulse 1236 to the word lines, wherein the voltage of the impulse 1236 is greater than the threshold voltage of the access device. The third read step 1216 may further comprise applying an impulse 1246 to the source line. If the resistance read is larger than a chosen resistance, the resetting of the memory cell is ended.

If the resistance of the memory cell is not higher than a threshold value, then the writing and reading steps discussed about are repeated. It should be noted that the impulse applied to the word lines during successive write steps continue to increase until the resistance is larger than the chosen resistance.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims. Any and all patents, patent applications and printed publications referred to above are hereby incorporated by reference.

What is claimed is:

1. A method for resetting a phase change memory cell having a memory cell threshold voltage, the memory cell threshold voltage being a voltage at which at least a portion of the amorphous phase change material of the memory cell starts to break down, the memory cell coupled to an access device having an access device threshold voltage, comprising:
selecting a voltage $V_{WL}$, voltage $V_{WL}$ being larger than the access device threshold voltage;
reading a resistance of the memory cell by (a) applying a voltage, smaller than the memory cell threshold voltage, to a bit line coupled to the memory cell, and by (b) applying a voltage, larger than the access device threshold voltage, to a word line coupled to the access device;
if the resistance is larger than a chosen resistance, end the resetting of the memory cell;
if the resistance is not larger than the chosen resistance, then proceed by:
applying a voltage, larger than the memory cell threshold voltage, to the bit line; and
applying voltage $V_{WL}$ to the word line to reset the memory cell;
reading the resistance of the memory cell by (a) applying a voltage, smaller than the memory cell threshold voltage, to the bit line coupled to the memory cell, and by (b) applying a voltage, larger than the access device threshold voltage, to the word line;
if the resistance is larger than the chosen resistance, end the resetting of the memory cell;
if the resistance is not larger than the chosen resistance, then proceed by:
applying a voltage, larger than the memory cell threshold voltage, to the bit line;
increasing voltage $V_{WL}$ by a voltage $\Delta V$; and
applying increased voltage $V_{WL}$ to the word line to reset the memory cell; and
return to the second reading step.

2. The method according to claim 1, further comprising limiting the number of times the reading return step may be carried out for a memory cell.

3. A method for resetting a phase change memory cell having a memory cell threshold voltage, the memory cell threshold voltage being a voltage at which at least a portion of the amorphous phase change material of the memory cell starts to break down, the memory cell coupled to an access device having an access device threshold voltage, comprising:
reading a first resistance of the memory cell by (a) applying a voltage, smaller than the memory cell threshold voltage, to a bit line coupled to the memory cell, and by (b) applying a voltage, larger than the access device threshold voltage, to a word line coupled to the access device;
if the first resistance is larger than a chosen resistance, end the resetting of the memory cell;
if the first resistance is not larger than the chosen resistance, then proceed by:
applying a voltage, larger than the memory cell threshold voltage, to the bit line, and applying a voltage $V_{WL}$, larger than the access device threshold voltage, to the word line;
reading a second resistance of the memory cell by (a) applying a voltage, smaller than the memory cell threshold voltage, to the bit line, and (b) applying a voltage, larger than the access device threshold voltage, to the word line;
if the second resistance is larger than the chosen resistance, end the resetting of the memory cell; and
if the second resistance is not larger than the chosen resistance, then proceed by:
applying a voltage, larger than the memory cell threshold voltage, to the bit line, increasing voltage $V_{WL}$ to obtain an increased voltage $V_{WL}$, and applying the increased voltage $V_{WL}$ to the word line.

4. The method according to claim 3 further comprising the following after the step of applying the increased voltage $V_{WL}$:
reading a third resistance of the memory cell by (a) applying a voltage, smaller than the memory cell threshold voltage, to the bit line, and (b) applying a voltage, larger than access device threshold voltage, to the word line;
if the third resistance is larger than the chosen resistance, end the resetting of the memory cell; and
if the third resistance is not larger than or equal to a chosen resistance, then return to the last step of applying a voltage of claim 1.

5. A method for resetting a phase change memory cell having a memory cell threshold voltage, the memory cell threshold voltage being a voltage at which at least a portion of the amorphous phase change material of the memory cell starts to break down, the memory cell coupled to a pair of MOSFETs having an access device threshold voltage, comprising:
applying a first voltage to a bit line coupled with the memory cell, wherein the first voltage is lower than the memory cell threshold voltage, and applying a second voltage to a pair of word lines coupled to the pair of MOSFETs, so as to read a first resistance of the memory cell, the second voltage being greater than the access device threshold voltage;
if the first resistance is larger than a chosen resistance, end the resetting of the memory cell, and if not then proceed by:
applying a third voltage to the bit line, wherein the third voltage is higher than the memory cell threshold voltage, and applying a fourth voltage to the pair of word lines so as to program the memory cell, the fourth voltage being greater than the access device threshold voltage;
applying the first voltage to the bit line and applying the second voltage to the pair of word lines, so as to read a second resistance of the memory cell; and
if the second resistance is larger than a chosen resistance, end the resetting of the memory cell, and if not then proceed by:
applying the third voltage to the bit line and applying a fifth voltage to the pair of word lines so as to program the memory cell, the fifth voltage being the sum of the fourth voltage and a predetermined voltage.

6. The method according to claim 5 further comprising the following after the last step of applying the third voltage:
applying the first voltage to the bit line and applying the second voltage to the pair of word lines, so as to read a third resistance of the memory cell; and
if the third resistance is larger than a chosen resistance, end the resetting of the memory cell, and if not then proceed by:
applying the third voltage to the bit line and applying a sixth voltage to the pair of word lines so as to program the memory cell, the sixth voltage being the sum of the fifth voltage and a second predetermined voltage.

7. A programmable resistive memory system, comprising:
a memory cell device comprising a plurality of programmable resistive memory cells, wherein each memory cell has a memory cell threshold voltage, the memory cell threshold voltage being a voltage at which at least a portion of the amorphous phase change material of the memory cell starts to break down, and wherein each memory cell is coupled to an access device having an access device threshold voltage; and
a controller for programming the memory cell device, the controller configured for resetting a memory cell by:
selecting a voltage $V_{WL}$, voltage $V_{WL}$ being larger than the access device threshold voltage;
reading a resistance of the memory cell by (a) applying a voltage, smaller than the memory cell threshold voltage, to a bit line coupled to the memory cell, and by (b) applying a voltage, larger than the access device threshold voltage, to a word line coupled to the access device;
if the resistance is larger than a chosen resistance, end the resetting of the memory cell;
if the resistance is not larger than the chosen resistance, then proceed by:
applying a voltage, larger than the memory cell threshold voltage, to the bit line; and
applying voltage $V_{WL}$ to the word line to reset the memory cell;
reading the resistance of the memory cell by (a) applying a voltage, smaller than the memory cell threshold voltage, to the bit line coupled to the memory cell, and by (b) applying a voltage, larger than the access device threshold voltage, to the word line;
if the resistance is larger than the chosen resistance, end the resetting of the memory cell;
if the resistance is not larger than the chosen resistance, then proceed by:
applying a voltage, larger than the memory cell threshold voltage, to the bit line;
increasing voltage $V_{WL}$ by a voltage $\Delta V$; and
applying increased voltage $V_{WL}$ to the word line to reset the memory cell; and
return to the second reading step.

8. The programmable resistive memory system according to claim 7 wherein each memory cell comprises phase change materials.

9. The programmable resistive memory system according to claim 8 wherein the phase change material comprises GST.

10. The programmable resistive memory system according to claim 7 wherein the controller is conductively coupled with the bit line and the word line for each memory cell.

11. The programmable resistive memory system according to claim 7 wherein the controller comprises an energy source for applying voltages to the bit line and the word line for each memory cell.

12. A computer program product including computer instructions for programming a memory cell device comprising a plurality of programmable resistive memory cells, wherein each memory cell has a memory cell threshold voltage, the memory cell threshold voltage being a voltage at which at least a portion of the amorphous phase change material of the memory cell starts to break down, and wherein each memory cell is coupled to an access device having an access device threshold voltage, the computer instructions including instructions for executing the following for resetting a memory cell:
selecting a voltage $V_{WL}$, voltage $V_{WL}$ being larger than the access device threshold voltage;
reading a first resistance of the memory cell by (a) applying a voltage, smaller than the memory cell threshold voltage, to a bit line coupled to the memory cell, and by (b) applying a voltage, larger than the access device threshold voltage, to a word line coupled to the access device;
if the resistance is larger than a chosen resistance, end the resetting of the memory cell;
if the resistance is not larger than the chosen resistance, then proceed by:
applying a voltage, larger than the memory cell threshold voltage, to the bit line; and
applying voltage $V_{WL}$ to the word line to reset the memory cell;
reading the resistance of the memory cell by (a) applying a voltage, smaller than the memory cell threshold voltage, to the bit line coupled to the memory cell, and by (b) applying a voltage, larger than the access device threshold voltage, to the word line;
if the resistance is larger than the chosen resistance, end the resetting of the memory cell;
if the resistance is not larger than the chosen resistance, then proceed by:
applying a voltage, larger than the memory cell threshold voltage, to the bit line;
increasing voltage $V_{WL}$ by a voltage $\Delta V$; and
applying increased voltage $V_{WL}$ to the word line to reset the memory cell; and
return to the second reading step.

* * * * *